(12) United States Patent
Lo et al.

(10) Patent No.: US 8,058,560 B2
(45) Date of Patent: Nov. 15, 2011

(54) BENDABLE AREA DESIGN FOR FLEXIBLE PRINTED CIRCUITBOARD

(75) Inventors: Chin-Wen Lo, Taichung (TW); Chia-Ning Kao, Taichung (TW)

(73) Assignee: Wintek Corporation, Taichung (TW)

( * ) Notice: Subject to any disclaimer, the term of this patent is extended or adjusted under 35 U.S.C. 154(b) by 808 days.

(21) Appl. No.: 12/141,221

(22) Filed: Jun. 18, 2008

(65) Prior Publication Data

US 2009/0120670 A1    May 14, 2009

(30) Foreign Application Priority Data

Nov. 14, 2007   (TW) .................................. 96142948 A

(51) Int. Cl.
*H05K 1/00* (2006.01)

(52) U.S. Cl. ..... 174/254; 361/749; 174/250; 174/117 F; 174/117 FF; 439/67; 439/77

(58) Field of Classification Search .................. 174/254, 174/250, 117 F, 117 FF; 361/749; 439/67, 439/77

See application file for complete search history.

(56) References Cited

U.S. PATENT DOCUMENTS

| | | | |
|---|---|---|---|
| 3,296,365 A * | 1/1967 | Basile ...................... | 174/117 FF |
| 3,914,531 A * | 10/1975 | Zell et al. ....................... | 174/36 |
| 4,470,195 A * | 9/1984 | Lang ................................ | 29/825 |
| 4,845,315 A * | 7/1989 | Stopper ........................ | 361/827 |
| 5,821,465 A * | 10/1998 | Tanaka et al. ................ | 174/88 R |
| 5,834,704 A * | 11/1998 | Tanaka .......................... | 174/254 |
| 5,903,440 A * | 5/1999 | Blazier et al. ................ | 361/749 |
| 6,407,669 B1 * | 6/2002 | Brown et al. .............. | 340/572.1 |
| 6,529,377 B1 * | 3/2003 | Nelson et al. ................ | 361/699 |
| 6,630,625 B1 * | 10/2003 | Akashi et al. ............... | 174/72 A |
| 6,631,559 B2 * | 10/2003 | Ueno ............................. | 29/861 |
| 7,307,215 B2 * | 12/2007 | Terada ......................... | 174/72 A |
| 7,342,178 B2 * | 3/2008 | Yang et al. .................... | 174/254 |
| 7,556,525 B2 * | 7/2009 | Chen et al. .................... | 439/498 |
| 2003/0095389 A1 * | 5/2003 | Samant et al. ................ | 361/749 |
| 2003/0102148 A1 * | 6/2003 | Ohara et al. ................ | 174/117 F |
| 2006/0225914 A1 * | 10/2006 | Tan .................................. | 174/254 |
| 2007/0046475 A1 * | 3/2007 | Carrender .................. | 340/572.7 |
| 2008/0179079 A1 * | 7/2008 | Ishii et al. ...................... | 174/254 |
| 2008/0289859 A1 * | 11/2008 | Mikado et al. ................ | 174/254 |

* cited by examiner

*Primary Examiner* — Hung S Bui
*Assistant Examiner* — James Wu
(74) *Attorney, Agent, or Firm* — WPAT., P.C.; Justin King

(57) ABSTRACT

A bendable area design for flexible printed circuitboard is disclosed. The flexible printed circuitboard (FPC) is comprised of: a flexible substrate; at least a circuit pattern; and a bendable area, being formed intersecting with the at least one circuit pattern and having at least a groove formed therein at a position corresponding to the intersection with the at least one circuit pattern; wherein the depth of the at least one groove is no larger than the thickness of the corresponding circuit pattern for preventing the circuit pattern from being cut off by the groove. By configuring the aforesaid bendable area in the FPC, stress generated by the bending of the FPC is restricted inside the bendable area effectively so that accurate control of the bending angle for bending FPC can be realized.

17 Claims, 4 Drawing Sheets

BENDABLE AREA DESIGN FOR FLEXIBLE PRINTED CIRCUITBOARD

FIELD OF THE INVENTION

The present invention relates to bendable area design for flexible printed circuitboard (FPC), and more particularly, to a flexible printed circuitboard (FPC) having grooves formed in its bendable area in a manner that the formation of such grooves conform with the bending stress lines produced by the bending of the FPC.

BACKGROUND OF THE INVENTION

A flexible printed circuit board (FPC) is a circuit board which can be easily bent and flexible, so that it is commonly used for connecting various parts of foldable electronic devices, such as clamshell phone hinges, etc. Thus, it is important to have a FPC capable of being bended at an exact position where is it is designed to be bended.

As shown in FIG. 1 and FIG. 2, a white line 11 is usually being marked on a conventional FPC 10 at a position where it is designed to be bended and is used for assisting an operator of a bending process to identify the position where the FPC is supported to be bended. However, as there can be tolerance for the marking of the while line 11 on the FPC 10 in addition to the error caused by the manual bending of the operator, accurate control of the bending angle for bending FPC 10 can not be realized.

There are some manufacturers trying to improve the aforesaid bending accuracy by hollowing a portion of their FPCs at positions where it is supposed to be bended, However, such method will damage the FPCs, causing the strength of the FPCs to reduce and sometimes even crack.

SUMMARY OF THE INVENTION

In view of the disadvantages of prior art, the object of the present invention is to provide a bendable area design for a flexible printed circuitboard, by which the flexible printed circuitboard (FPC) is configured with a specific structure formed in its bendable area so as to be used for controlling and restricting the stress generated by the bending of the FPC and thus accurate control of the bending angle for the bending of FPC can be achieved.

To achieve the above object, the present invention provides a flexible printed circuitboard (FPC) with bendable area comprising: at least a circuit pattern; and a bendable area, intersecting the at least one circuit pattern and having at least a groove formed therein at a position corresponding to the intersection with the at least one circuit pattern; wherein the at least one groove is formed in a manner that the circuit pattern is prevented from being cut off by the at least one groove. By configuring the aforesaid bendable area in the FPC, stress generated by the bending of the FPC is restricted inside the bendable area effectively.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
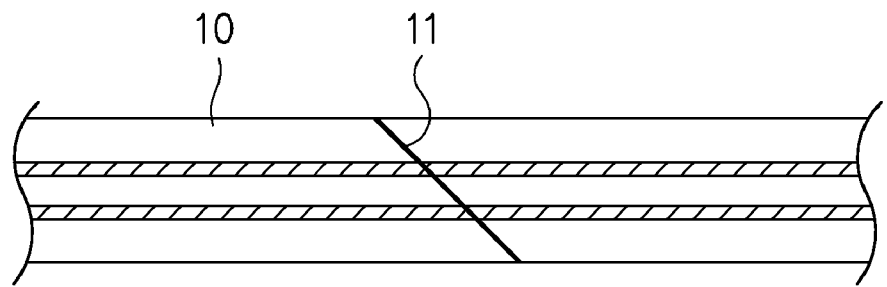
FIG. 1 shows a conventional flexible printed circuitboard.
Figure 2:
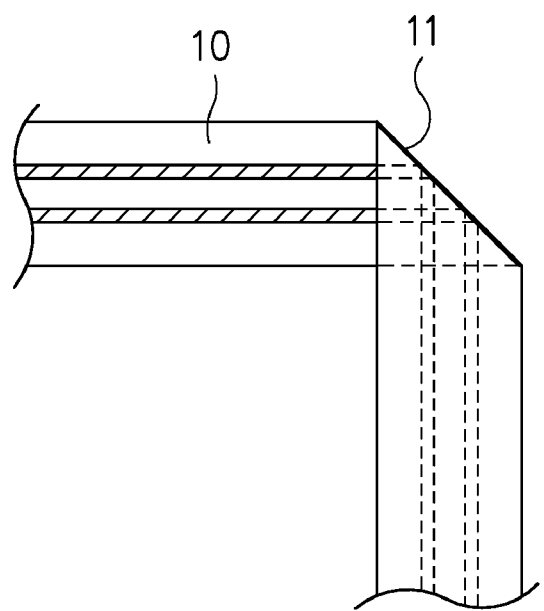
FIG. 2 shows another conventional flexible printed circuitboard.
Figure 3:
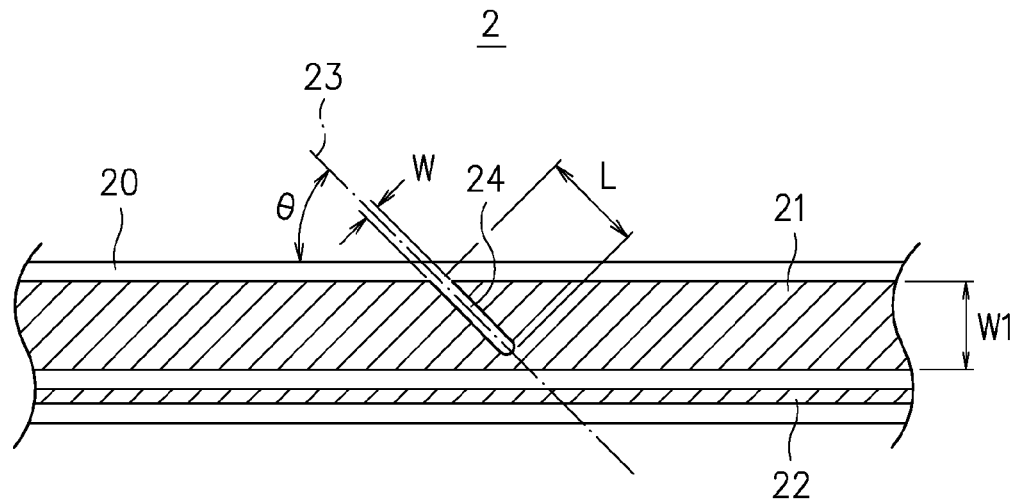
FIG. 3 is a top view showing a flexible printed circuitboard with bendable area according to an exemplary embodiment of the invention.

Please refer to FIG. 3, which is a top view showing a flexible printed circuitboard with bendable area according to an exemplary embodiment of the invention. The flexible printed circuitboard 2 comprises a flexible substrate 20, at least one circuit pattern, as the two circuit patterns 21, 22 shown in this embodiment, and a bendable area 23; in which two circuit patterns 21, 22 are formed on the flexible substrate 20 intersecting with the bendable area 23. In this exemplary embodiment, the bendable area 23 is so-constructed for enabling the flexible printed circuitboard 2 to be folded by a virtual diagonal line crossing a top surface of the flexible printed circuitboard 2 by 45 degrees. Moreover, there is a groove 24 formed in the bendable area 23 by etching.

Figure 4:
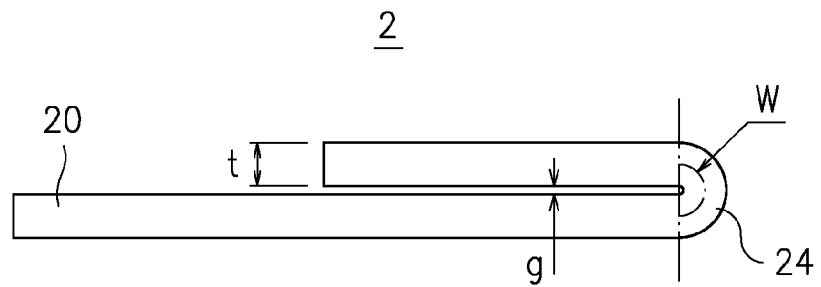
FIG. 4 is an enlarged partial side view of a bended flexible print circuitboard of the invention.

As shown in FIG. 3, the groove 24 etches away completely the corresponding portion of the circuit pattern 21, thereby the depth of the groove 24 is no larger than the thickness of the corresponding circuit pattern 21. It is noted that although the groove 24 can be formed in arbitrary length L, one should prevented the groove 24 from cutting of the circuit pattern 21. Moreover, by enlarging the width W1 of the circuit pattern 21, the circuit connection of the circuit pattern 21 still can be maintained even when the length L of the groove 24 is so long that the groove 24 almost cross the whole flexible printed circuitboard 2. In addition, with reference to FIG. 4, the groove 24 is designed according to the following equation:

$$W \geq (g/2 + t) * \pi$$

wherein W represents the width of the at least one groove;
g represents an interval formed inside the bended flexible printed circuitboard 2 at a position sandwiched between the two surfaces of the flexible printed circuitboard 2 facing toward each other by the bending;
t represents the thickness of the substrate;
$\pi$ represents ratio of the circumference of the circle to the diameter.

Figure 5:
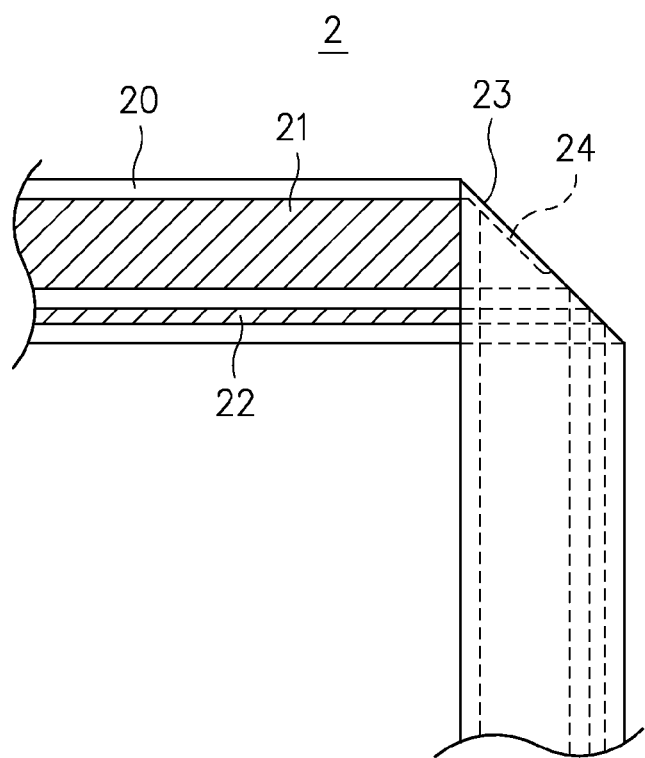
FIG. 5 is a schematic diagram showing the flexible printed circuitboard of FIG. 3 is being bended.

By designing the groove 24 according to the depth, length L and width W defined in the aforesaid equation, stress generated by the bending of the FPC 2 is restricted inside the bendable area 23 effectively so that accurate control of the bending angle for bending FPC 2 can be realized, as shown in FIG. 5.

Figure 6:
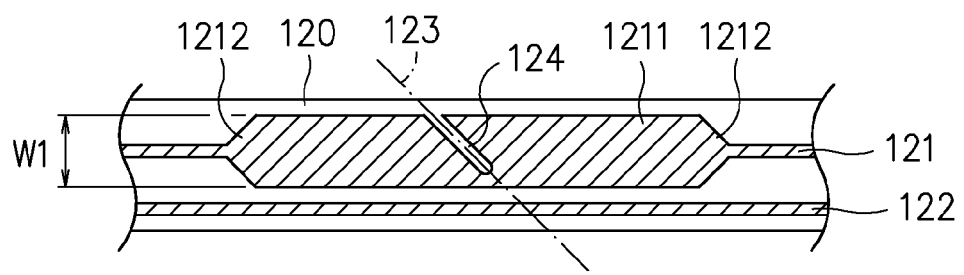
FIG. 6 to FIG. 11 are schematic diagrams showing various flexible printed circuitboards with bendable area according to different exemplary embodiments of the invention.

Please refer to FIG. 6, which shows a modification of the flexible printed circuitboard with bendable area shown in FIG. 3. The flexible printed circuitboard 12 comprises a substrate 120, two circuit patterns 121, 122 and a bendable area 123, in which the circuit pattern 121 is designed with a wide region 1211 that is wide enough to cover the whole bendable area 123 thus is provided for the formation of at least one groove. The exemplary embodiment shown in FIG. 6 is characterized in that: the two ends of the wide region 1211 away from the bendable area 123 are tapered into a width the same as that of another circuit pattern 122. Moreover, the two tapering regions 1212 of the circuit pattern 121 with the wide region is spaced from the bendable area 123 by a specific distance for an additional stress line to be formed at those tapering regions 1212 while bending.

Figure 7:
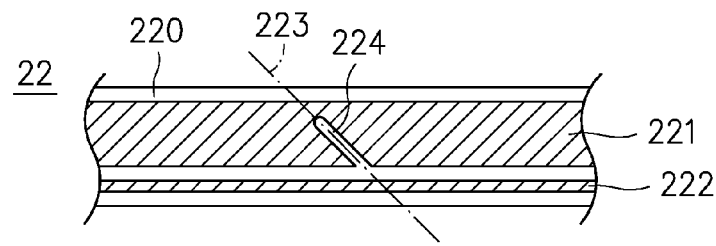

Please refer to FIG. 7 to FIG. 11, which are schematic diagrams showing various flexible printed circuitboards with bendable area according to different exemplary embodiments of the invention. In FIG. 7, the flexible printed circuitboard 22 comprises a substrate 220, a wide circuit patterns 221, a narrow circuit pattern 222 and a bendable area 223, in which a groove 224 is formed in the bendable area 223 at a position corresponding to the wide circuit pattern 221. The exemplary embodiment shown in FIG. 7 is characterized in that: the groove 224 is formed on the wide circuit pattern 221 at a side thereof neighboring to the narrow circuit pattern 222.

Figure 8:
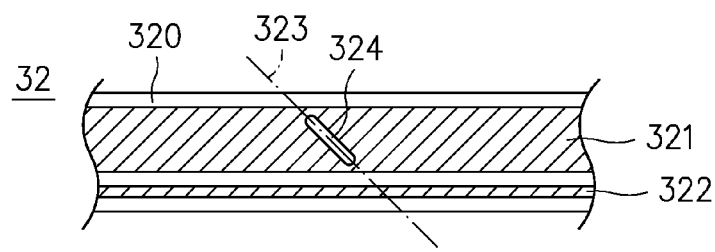

In FIG. 8, the flexible printed circuitboard 32 also comprises a substrate 320, a wide circuit patterns 321, a narrow circuit pattern 322 and a bendable area 323, in which a groove 324 is formed in the bendable area 323 at a position corresponding to the wide circuit pattern 321. The exemplary embodiment shown in FIG. 8 is characterized in that: the groove 324 is formed in the wider circuit pattern 321 at an about center position of the same while preventing the groove 324 from cutting off the wider circuit pattern 321.

Figure 9:
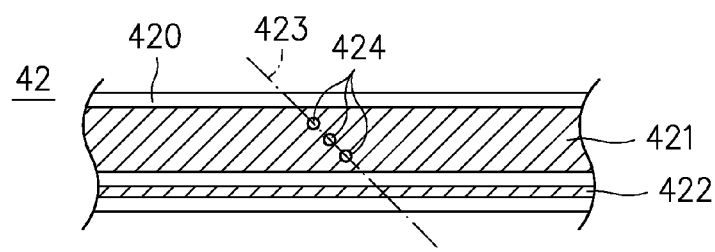

In FIG. 9, the flexible printed circuitboard 42 comprises a substrate 420, a wide circuit patterns 421, a narrow circuit pattern 422 and a bendable area 423. The exemplary embodiment shown in FIG. 9 is characterized in that: there are a plurality of grooves 424 being formed in the bendable area 423. It is noted that each of the plural grooves 424 can be in any geometrical shapes that is not limited by the circular shape shown in FIG. 9.

Figure 10:
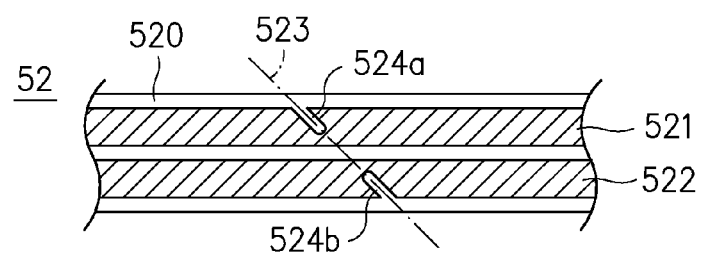

In FIG. 10, the flexible printed circuitboard 52 comprises a substrate 520, two circuit patterns 521, 522 of the same width and a bendable area 523. The exemplary embodiment shown in FIG. 10 is characterized in that: there are two grooves 524a, 524b being formed respectively on the two circuit patterns 521, 522 at positions corresponding to the bendable area 523 and at sides of the two circuit patterns 521, 522 that are away from each other.

Figure 11:
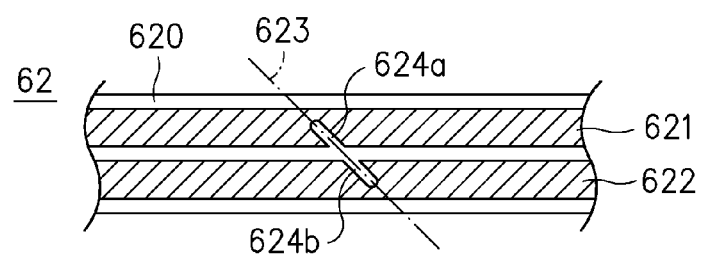

In FIG. 11, the flexible printed circuitboard 62 comprises a substrate 620, two circuit patterns 621, 622 of the same width and a bendable area 623. The exemplary embodiment shown in FIG. 11 is characterized in that: there are two grooves 624a, 624b being formed respectively on the two circuit patterns 621, 622 at positions corresponding to the bendable area 623 and at sides of the two circuit patterns 621, 622 that are neighboring to each other.

To sum up, the present invention provides a bendable area design for a flexible printed circuitboard, by which the flexible printed circuitboard (FPC) can be configured with a specific structure formed in its bendable area so as to be used for controlling and restricting the stress generated by the bending of the FPC and thus accurate control of the bending angle for the bending of FPC can be achieved. It is noted that the shape, amount and position of the aforesaid groove are not limited by the those described in the foregoing embodiments, but is to reduce the thickness of the FPC at it bendable area, or to etch the portion of circuit pattern intersected by the bendable area without completely cutting off the referring portion.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A flexible printed circuit board with bendable area, comprising:
   a flexible substrate, further comprising:
      at least a circuit pattern, each formed on the flexible substrate; and
      a bendable area, configured in the flexible substrate while intersecting the at least one circuit pattern; and
   at least a groove, formed in the bendable area at a position corresponding to the intersection with the at least one circuit pattern;
   wherein the flexible substrate has two circuit patterns formed thereon, and one of the two circuit patterns is configured with a region that is wide enough to cover the whole bendable area therein and thus is provided for the formation of the at least one groove while the two ends of the wide region away from the bendable area are tapered into a width the same as that of another circuit pattern.

2. The flexible printed circuit board with bendable area of claim 1, wherein the at least one groove is formed intersecting the circuit pattern by etching while enabling the depth of the at least one groove is no larger than the thickness of the corresponding circuit pattern.

3. The flexible printed circuit board with bendable area of claim 2, wherein the formation of the at least one groove etches away completely the corresponding portion of the circuit pattern intersected thereby in a manner that a gap is formed on the circuit pattern accordingly.

4. The flexible printed circuit board with bendable area of claim 3, wherein the gap is formed on the circuit pattern in a manner that the circuit pattern is not cut off by the gap.

5. The flexible printed circuit board with bendable area of claim 4, wherein the gap comprises a plurality of recesses, and the corresponding circuit pattern is not cut off by the total length of the plural recess.

6. The flexible printed circuit board with bendable area of claim 1, wherein the at least one groove is designed according to the following equation:

$$W \geq (g/2 + t) * \pi;$$

wherein W represents the width of the at least one groove;
   g represents an interval formed inside the bended flexible printed circuitboard at a position sandwiched between the two surfaces of the flexible printed circuitboard facing toward each other by the bending;
   t represents the thickness of the substrate;
   $\pi$ represents ratio of the circumference of the circle to the diameter.

7. The flexible printed circuit board with bendable area of claim 1, wherein any tapering region of the circuit pattern with the wide region is spaced from the bendable area by a specific distance.

8. The flexible printed circuit board with bendable area of claim 1, wherein the flexible substrate is comprised of: two circuit patterns;

and one bendable area, intersecting the two circuit patterns and having at least a groove formed therein at a position corresponding to the intersection with the at least one of the two circuit patterns.

9. The flexible printed circuit board with bendable area of claim 8, wherein the widths of the two circuit pattern are different while enabling the at least one groove to be formed in the circuit pattern that is wider.

10. The flexible printed circuit board with bendable area of claim 9, wherein the at least one groove formed in the wider circuit pattern at a position that is away from the narrower circuit pattern.

11. The flexible printed circuit board with bendable area of claim 9, wherein the at least one groove formed in the wider circuit pattern at a position that is close to the narrower circuit pattern.

12. The flexible printed circuit board with bendable area of claim 9, wherein the at least one groove formed in the wider circuit pattern at an about center position of the same while preventing the at least one groove from cutting off the wider circuit pattern.

13. The flexible printed circuit board with bendable area of claim 9, wherein there are a plurality of grooves.

14. The flexible printed circuit board with bendable area of claim 13, wherein each of the grooves is shaped as a shape selected from the group consisting a circular shape and other geometrical shapes.

15. The flexible printed circuit board with bendable area of claim 8, wherein the widths of the two circuit patterns are about the same and each of the two circuit patterns has at least one groove formed thereon.

16. The flexible printed circuit board with bendable area of claim 15, wherein the grooves respectively formed on the two circuit patterns are being formed at sides of the two circuit patterns that are away from each other.

17. The flexible printed circuit board with bendable area of claim 15, wherein the grooves respectively formed on the two circuit patterns are being formed at sides of the two circuit patterns that are neighboring to each other.

* * * * *